(12) United States Patent
Dockerty et al.

(10) Patent No.: US 6,399,989 B1
(45) Date of Patent: Jun. 4, 2002

(54) RADIATION HARDENED SILICON-ON-INSULATOR (SOI) TRANSISTOR HAVING A BODY CONTACT

(75) Inventors: Robert Dockerty, Fairfax Station; Nadim Haddad, Oakton; Michael J. Hurt, Falls Church, all of VA (US); Frederick T. Brady, San Antonio, TX (US)

(73) Assignee: BAE Systems Information and Electronic Systems Integration Inc., Rockville, MD (US)

( * ) Notice: Subject to any disclaimer, the term of this patent is extended or adjusted under 35 U.S.C. 154(b) by 26 days.

(21) Appl. No.: 09/630,216

(22) Filed: Aug. 1, 2000

Related U.S. Application Data
(60) Provisional application No. 60/146,996, filed on Aug. 3, 1999, and provisional application No. 60/171,569, filed on Dec. 23, 1999.

(51) Int. Cl.[7] .......................... H01L 27/01; H01L 27/12; H01L 31/0392
(52) U.S. Cl. .......................... 257/347; 257/348; 257/349
(58) Field of Search ................................ 257/347, 348, 257/349, 353, 351; 438/479, 480, 517

(56) References Cited

U.S. PATENT DOCUMENTS

| | | | |
|---|---|---|---|
| 4,692,783 A | 9/1987 | Monma et al. | 257/206 |
| 4,876,581 A | 10/1989 | Ishijima | 257/345 |
| 4,906,587 A | 3/1990 | Blake | 438/151 |
| 4,965,213 A | 10/1990 | Blake | 438/154 |
| 4,974,051 A | 11/1990 | Matloubian et al. | 257/347 |
| 5,185,280 A | 2/1993 | Houston et al. | 257/327 |
| H1435 H | 5/1995 | Cherne et al. | 257/351 |
| 5,670,388 A | 9/1997 | Machesney et al. | 438/164 |
| 5,804,858 A | 9/1998 | Hsu et al. | 257/347 |
| 5,811,855 A | 9/1998 | Tyson et al. | 257/349 |
| 5,818,085 A | 10/1998 | Hsu et al. | 257/347 |
| 5,821,575 A * | 10/1998 | Mistry et al. | 257/281 |
| 6,225,665 B1 * | 5/2001 | Hirano | 257/347 |

* cited by examiner

Primary Examiner—Steven Loke
Assistant Examiner—Shouxiang Hu
(74) Attorney, Agent, or Firm—Antony P. Ng; Bracewell & Patterson, L.L.P.

(57) ABSTRACT

A radiation hardened silicon-on-insulator transistor is disclosed. A dielectric layer is disposed on a substrate, and a transistor structure is disposed on the dielectric layer. The transistor structure includes a body region, a source region, a drain region, and a gate layer. The body region is formed on a first surface portion of the dielectric layer, the source region is formed on a second surface portion of the dielectric layer contiguous with the first surface portion, the drain region is formed on a third surface portion of the dielectric layer contiguous with the first surface portion, and the gate layer overlies the body region and being operative to induce a channel in that portion of the body region disposed between and adjoining the source region and the drain region. In addition, multiple diffusions are placed across two edges of the source region. These diffusions are ohmically connected to the body region via a body contact, and these diffusions are also connected to the source region by a self-aligned salicide.

6 Claims, 3 Drawing Sheets

RADIATION HARDENED SILICON-ON-INSULATOR (SOI) TRANSISTOR HAVING A BODY CONTACT

CROSS REFERENCE TO RELATED APPLICATIONS

The present application is related to the following provisional applications:

1. Ser. No. 60/146,966, filed on Aug. 6, 1999, and
2. Ser. No. 60/171,569, filed on Dec. 23, 1999, which are incorporated by reference herein.

BACKGROUND OF THE INVENTION

1. Technical Field

The present invention relates to integrated circuits in general, and in particular to integrated circuits having silicon-on-insulator transistors. Still more particularly, the present invention relates to a radiation hardened silicon-on-insulator transistor having a body contact.

2. Description of the Prior Art

With silicon-on-insulator (SOI) processing technology, field effect transistors are formed in a layer of semiconductor material that overlies an insulating layer such as silicon dioxide or sapphire. SOI technology offers several significant advantages over transistors formed in a bulk silicon wafer. For example, a bulk silicon transistor has its active terminals disposed adjacent the bulk silicon wafer, and as a result, parasitic capacitance is present at the junction between source and drain regions of the bulk silicon transistor and the well or bulk silicon substrate. Other problems with bulk silicon transistors include the possibility of junction breakdown between the source or drain regions and the bulk silicon wafer, together with the formation of undesired parasitic bipolar transistors that give rise to device latch-up problems.

In contrast, SOI transistors have their active regions (i.e., the source, drain, and channel) formed adjacent an underlying insulating layer, and as a result, undesired parasitic elements are significantly reduced- or even eliminated. SOI technology also significantly reduces junction capacitance and junction leakage due to the reduced exposed junction area, which leads to improved circuit performance and higher circuit density.

Despite of the above-mentioned advantages, SOI technology also has its own inherent problems. All of these problems can be attributed primarily to the fact that, in an SOI transistor, a body node underlying a transistor gate is isolated from a bulk silicon substrate by an insulating layer. Thus, the body node is electrically floating. Most often, this floating body node is undesirable since it causes problems in SOI transistor operation. For example, for a partially-depleted SOI transistor, a phenomenon associated with impact ionization can occur. More specifically, when an electron-hole pair is formed by ionization of a lattice atom by an electron, the hole migrates towards the source of the SOI transistor. Since the well is not tied to the source, the excess holes generated are collected in the well, thereby raising the well potential and, thus, modifying the characteristics of the SOI transistor. The resulting change in voltage lowers the effective threshold voltage relative to the drain-to-source voltage, and increases the drain current. This results in the well-known "kink" or sharp irregularity in a current-voltage curve of the partially-depleted SOI transistor. This "kink" effect may seriously degrade the performance of the SOI transistor.

In addition, the floating body node of an SOI transistor may permit parasitic bipolar (e.g., NPN) devices to be undesirably turned on. Further, a parasitic back channel transistor, comprised of the substrate acting as the gate and the insulating layer acting as the gate dielectric, may provide a drain-to-source leakage path along the body node near its interface with the insulating layer.

Typically, the inherent problems associated with the floating body node of an SOI transistor can be countered by connecting the body node to a source terminal. In normal transistor operations, the source terminal is connected to an electrical ground potential. Thus, the holes generated by impact ionization are then attracted to the fixed ground connection through a body contact (or a body tie). Some prior art approaches for connecting the body node to a fixed potential include body-tied-to-source (BTS) structures (also known as well shunts or well contacts), H-type gate structure devices (or H-transistors), T-type gate structure devices, and local well ties. However, each of these approaches has its drawbacks.

For example, BTS structures are typically fabricated at the outer periphery of the active transistor regions. Generally, if a body contact is made outside the source terminal, the body contact takes up valuable area on the substrate, reducing the electrical width of the active transistor regions. Moreover, BTS structures are extremely sensitive to alignments commonly achievable by various processing techniques. Further, BTS structures result in an unidirectional transistor operation (i.e., the source and drain terminals cannot be used interchangeably).

Another problem with BTS structures is "snapback." More specifically, as a result of electron/hole generation at the drain of an n-channel transistor through impact ionization, hole current flows to the substrate contact of a P-well. For bulk silicon transistors, the cross-sectional area to the P-well contact is large and the resistance is small. On the other hand, thin film SOI devices have a much smaller cross-sectional area and a corresponding increase in body contact resistance. Thus, the only conduction path to the body contact is under the channel, which further reduces the cross-sectional area.

Consequently, the same amount of hole current generated in an SOI device passes through a much smaller cross-sectional area relative to a bulk transistor, which causes a much larger voltage rise in the channel region. This voltage rise lowers the barrier at the source and injects more electrons into the channel region. This increase in current causes a larger amount of hole current to be generated, which results in additional barrier lowering. As the cycle continues, the barrier is lowered even more such that more electrons are injected into the channel region; more hole current is generated; and the barrier lowers still more. This uncontrolled state, caused by the hot carrier effect, is known as "snapback." The hot carrier effect is primarily a problem with N-channel devices because of the high electron mobility. Essentially, as impact ionization occurs and more electron-hole pairs are created, the holes continue to raise the well potential. Eventually, the transistor enters the snapback state and latches on. In this internal latch-up state, the transistor cannot be shut off unless the power supply is removed.

H-transistors are generally only effective below a certain device width for a given film thickness and doping profile. Above this device width, the resistance of the well or body node becomes prohibitively high, thereby negating the effectiveness of the resulting transistor. In other words, as the well resistance rises, the corresponding voltage rise across the body node becomes undesirably large. Further, there is a significant substrate area penalty associated with the use of H-transistor body contacts.

T-type devices have similar problems as H-transistors, except that T-type devices require device widths only about one-half of those used with transistors. As such, only one side of the T-type device is effective in suppressing parasitic sidewall characteristics of the underlying transistor. T-type device utilizes local well ties that offer little, if any, advantage to SOI transistor device designs. The disadvantages associated with local well ties include area penalty, difficulty in using a trench isolation structure, relatively high well resistance, and no suppression of parasitic sidewall characteristics.

Consequently, it would be desirable to provide an improved body contact for an SOI transistor.

SUMMARY OF THE INVENTION

In accordance with a preferred embodiment of the present invention, a dielectric layer is disposed on a substrate, and a transistor structure is disposed on the dielectric layer. The transistor structure includes a body region, a source region, a drain region, and a gate layer. The body region is formed on a first surface portion of the dielectric layer, the source region is formed on a second surface portion of the dielectric layer contiguous with the first surface portion, the drain region is formed on a third surface portion of the dielectric layer contiguous with the first surface portion, and the gate layer overlies the body region and being operative to induce a channel in that portion of the body region disposed between and adjoining the source region and the drain region. In addition, multiple diffusions are placed across two edges of the source region. These diffusions are ohmically connected to the body region via a body contact, and these diffusions are also connected to the source region by a self-aligned salicide.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1A:
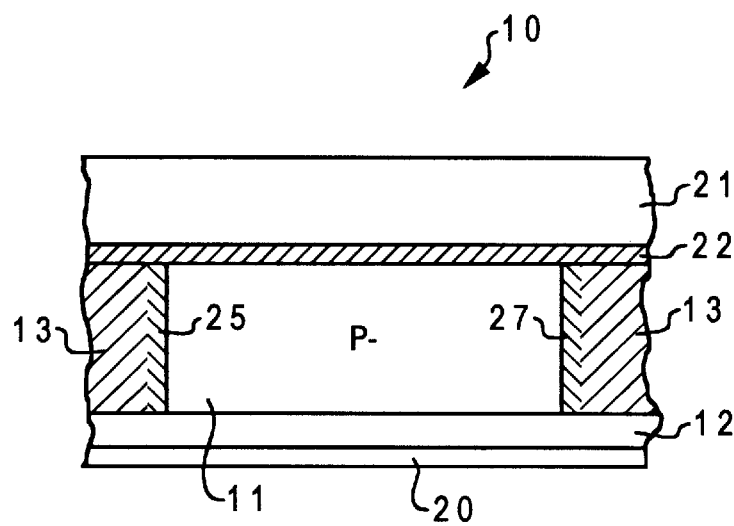
FIG. 1a is a cross-sectional view of a typical silicon-on-insulator transistor.
Figure 1B:
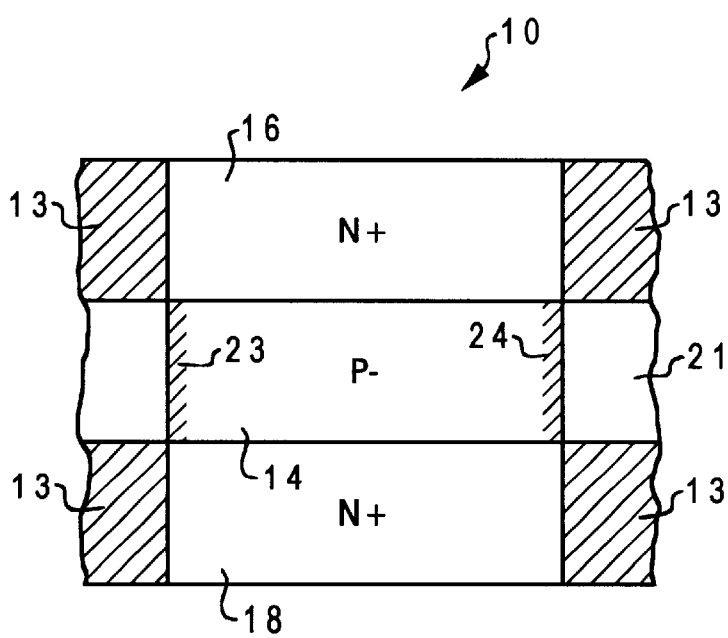
FIG. 1b is a top view of the silicon-on-insulator transistor from FIG. 1.

Referring now to the drawings and in particular to FIGS. 1a and 1b, there are illustrated a cross-sectional view and a top view of a typical silicon-on-insulator (SOI) transistor. As shown, an N-channel SOI transistor 10 includes a silicon mesa layer 11 disposed atop a silicon dioxide layer 12. Silicon dioxide layer 12 is located on top of a substrate layer 20. The sidewall perimeter of silicon mesa layer 11 is bounded by an oxide dielectric layer 13. Silicon mesa layer 11 contains a P-type body/channel region 14 disposed between and immediately contiguous with an N+ source region 16 and an N+ drain region 18. Overlying P-type body/channel region 14 and extending onto the surrounding support substrate is a doped polysilicon gate layer 21 insulated from silicon mesa layer 11 by a thin dielectric layer 22.

Because the surface of P-type body/channel region 14 is susceptible to inversion in the presence of ionizing radiation, there is the danger of a leakage path or parasitic channel being induced along body/channel sidewalls 23, 24 between source region 16 and drain region 18. Moreover, regardless of the potential for exposure to ionizing radiation, SOI transistor 10 may still suffer from extraordinary current leakage in its OFF state due to the inability of some manufacturing processes to accurately control channel doping along the edges of SOI transistor 10 (beneath polysilicon gate overlay 21) and due to the lack of control of trapped charge build-up along surface portions 25, 27 of dielectric layer 13 that is immediately adjacent to P-type silicon body 14.

Another problem associated with SOI transistor 10 is that body/channel region 14, being situated atop dielectric layer 12, is not readily accessible to be terminated to a $V_{dd}$ node (or a $V_{ss}$ node in the case of an N-channel device) so that the potential of body/channel region 14 effectively "floats." The floating body/channel region 14 can severely degrade the performance of SOI transistor 10. For example, the saturation region of SOI transistor 10 may be subject to the "kink" effect and the parasitic NPN devices may be permitted to be turned on to cause a latch-up situation.

As a preferred embodiment of the present invention, several diffusions are placed across the two edges of a source region of a SOI transistor. These diffusions have an opposite doping from that of the source region of the SOI transistor. For example, $P^+$ diffusions are placed across edges of an $N^+$ source region, or $N^+$ diffusions are placed across edges of a $P^+$ source region. These oppositely doped diffusions are ohmically connected to the body region of the SOI transistor via a body contact. The oppositely doped diffusions are also connected to the source region of the SOI transistor by a salicide.

Figure 2:
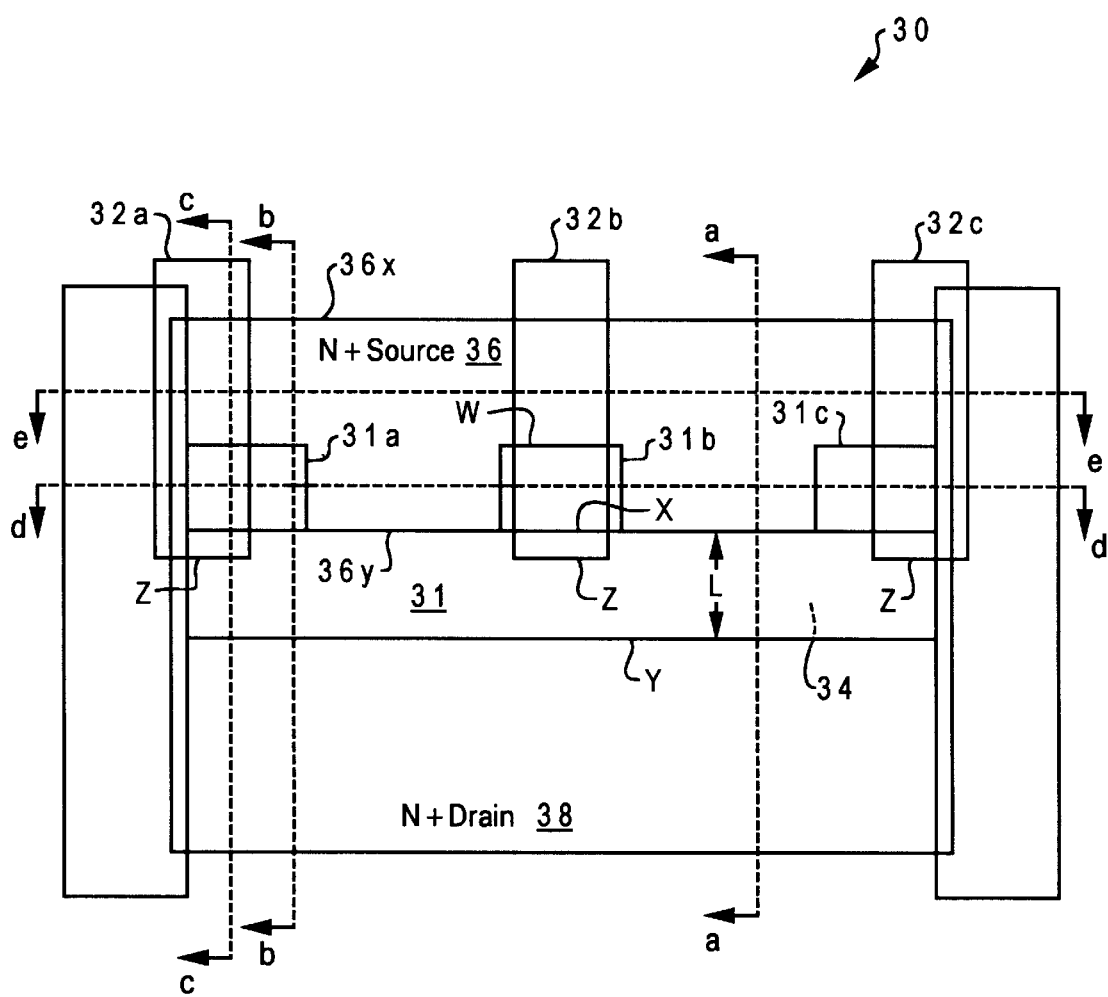
FIG. 2 is a top view of a silicon-on-insulator transistor in accordance with a preferred embodiment of the present invention.

With reference now to FIG. 2, there is illustrated a top view of an SOI transistor, in accordance with a preferred embodiment of the present invention. For better understanding of the topology shown in FIG. 2, FIG. 2 should be viewed in conjunction with FIGS. 3a–3e. FIGS. 3a–3e are various cross-sectional views of the SOI transistor from FIG. 2 as indicated by the labelled arrows. As shown, an N-channel SOI transistor 30 includes a polysilicon gate 31, a P-type body region 34 disposed between and immediately contiguous with an $N^+$ source region 36 and an $N^+$ drain region 38. Polysilicon gate 31 overlies P-type body region 34. In addition, polysilicon gate 31, P-type body region 34, $N^+$ source region 36, and an $N^+$ drain region 38 are disposed on top of a buried oxide layer 41 and a silicon substrate 42, as depicted in FIGS. 3a–3e.

$P^+$ diffusions 32a, 32b, and 32c are formed across a top edge 36x and a bottom edge 36y of $N^+$ source region 36. $P^+$ diffusions 32a–32c extend up to the edge of polysilicon gate 31 and are in ohmic contact with P-type body region 34 that is located under polysilicon gate 31. The ohmic contact between each of $P^+$ diffusions 32a–32c and P-type body region 34 is provided by a respective body contact. In addition, P+ diffusions 32a–32c are electrically shorted to N+ source region 36 via a salicide. For N-channel SOI transistor 30, P+ diffusions 32a–32c block a leakage path that can develop between N+ source region 36 and N+ drain region 38 when large amounts of positive charges are introduced into the shallow trench isolation by ionizing radiation. Preferably, P+ diffusions 32a–32c have a doping concentration of $1^{18}$-$1^{19}$ cm$^{-3}$ and a depth of 0.1–0.2 $\mu$m for the 0.25 $\mu$m generation technology.

Additional diffusions that are similar to P+ diffusions 32a–32c can be placed across N+ source region 36 of wide devices in order to lower the source-to-body resistance of the wide devices. As for minimum channel length devices, polysilicon gate 31 may be extended more towards N+ source region 36 to guarantee the overlapping between P+ diffusions 32a–32c and polysilicon gate 31. As shown in FIG. 2, polysilicon gate 31 is extended by extended gate areas 31a, 31b, and 31c to connect to P+ diffusions 32a, 32b, and 32c, respectively. As for minimum channel width devices, P+ diffusion 32b and extended gate area 31b are not required.

Also, edge Z of P+ diffusions 32a–32c must lie between edge X and edge Y of polysilicon gate 36 in order for N-channel SOI transistor 30 to function. If edge Z of P+ diffusions 32a–32c lie above edge X of polysilicon gate 36, there will be no body contact. If edge Z of P+ diffusions 32a–32c lies below of poly edge Y of polysilicon gate 36, a new P+ diffusion will be formed in N+ drain region 38, and N+ drain region 38 will be electrically shorted to body region 34. As for minimum channel length devices, edge Z of P+ diffusions 32a–32c must lie between edge W and edge Y of polysilicon gate 36 in order for channel SOI transistor 30 to function. If edge Z of P+ diffusions 32a–32c lie above edge W of polysilicon gate 36, there will be no body contact.

The placement of P+ diffusions 32a–32c on N+ source region 36 is preferred over N+ drain region 38. If P+ diffusions 32a–32c are placed in N+ drain region 38, the corners of P+ diffusion 32b would cause field enhancement in the high field region at N+ drain region 38. This geometrical argument applies to all P+ diffusions 32a–32c. Since overlay and etch bias tolerance scale approximately with the minimum device design rule, the structure of P+ diffusion 32b will also be required for minimum channel length devices built using design rules smaller than 0.5 microns.

Figure 3A:
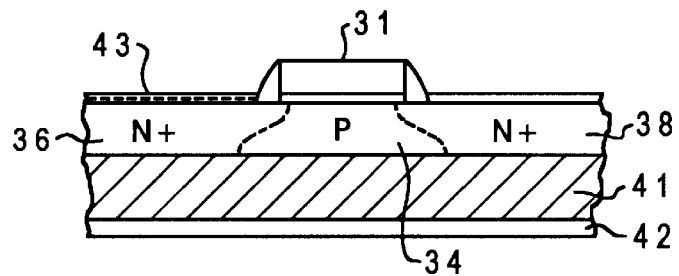
FIGS. 3a–3e are cross-sectional views of the silicon-on-insulator transistor from FIG. 2, in accordance with a preferred embodiment of the present invention.
Figure 3B:
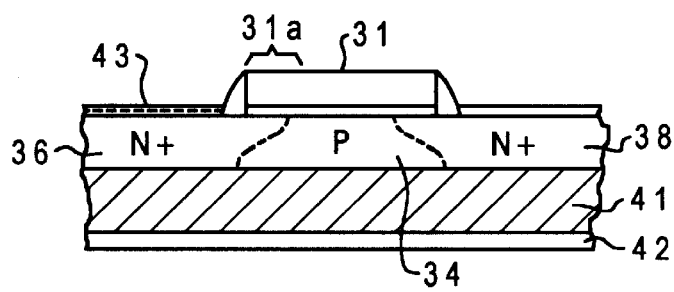
Figure 3C:
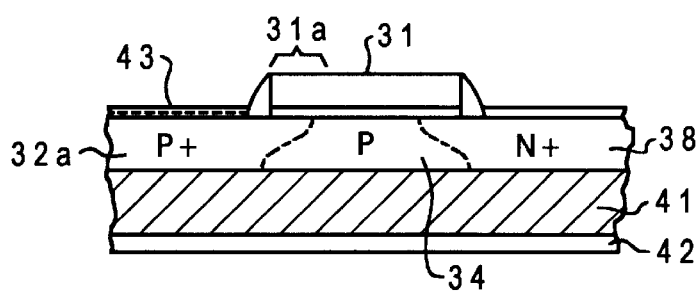
Figure 3D:
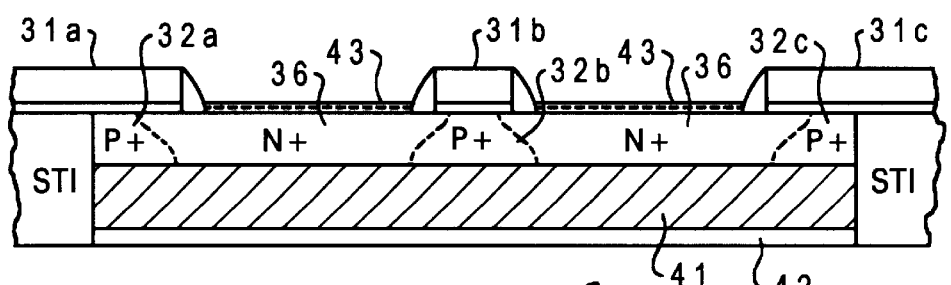
Figure 3E:
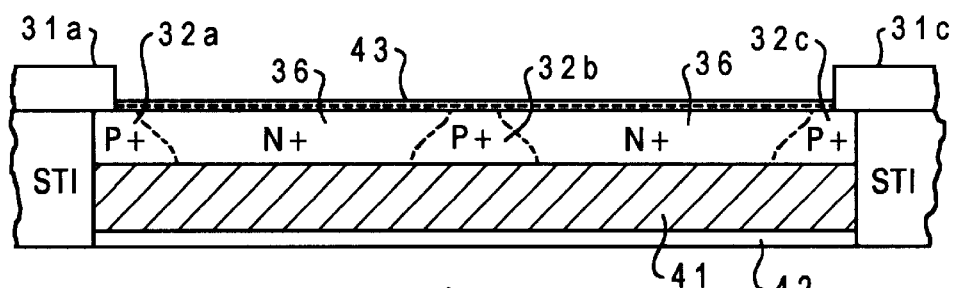

As mentioned previously, P+ diffusions 32a–32c are electrically shorted to N+ source region 36 via a salicide. This salicide layer 43 is formed atop each of N+ source regions 36, as depicted in FIGS. 3a–3c. Salicide layer 43 conductively bridges P+ diffusions 32a–32c and N+ source region 36 so that P-type body region 34 can also be shunted to N+ source region 36. As a result, N-channel SOI transistor 30 becomes more radiation hardened.

As has been described, the present invention provides an improved body contact for an SOI transistor. Although an N-channel SOI transistor is utilized to illustrate the present invention, it is understood the principle of the present invention is also applicable to P-channel SOI transistors. The improved body contact of the present invention is applicable to any integrated circuit devices, such as processors, controllers, memories, etc., that utilize SOI transistors.

While the invention has been particularly shown and described with reference to a preferred embodiment, it will be understood by those skilled in the art that various changes in form and detail may be made therein without departing from the spirit and scope of the invention.

What is claimed is:

1. A field effect transistor comprising:

a dielectric layer disposed on a substrate; and a transistor structure disposed on said dielectric layer, wherein said transistor structure includes:

a body region formed on a first surface portion of said dielectric layer;

a source region formed on a second surface portion of said dielectric layer contiguous with said first surface portion;

a drain region formed on a third surface portion of said dielectric layer contiguous with said first surface portion;

a gate layer overlying said body region and being operative to induce a channel region in said body region disposed between and adjoining said source region and said drain region; and a plurality of heavily doped diffusion regions placed across two opposite edges of said source region, wherein said plurality of heavily doped diffusion regions have a higher impurity concentration than said body region, and said plurality of heavily doped diffusion regions are extended into said channel region and ohmically connected to said channel region.

2. The field effect transistor according to claim 1, wherein said plurality of heavily doped diffusion regions are electrically connected to said source region by a salicide.

3. The field effect transistor according to claim 1, wherein said body region and said plurality of heavily doped diffusion regions are P-type doped, wherein said source region and drain region are N-type doped.

4. The field effect transistor according to claim 1, wherein said body region and said plurality of heavily doped diffusion regions are N-type doped, wherein said source region and drain region are P-type doped.

5. The field effect transistor according to claim 1, wherein a plurality areas of said gate layer are extended to overlap to said plurality of heavily doped diffusion regions for minimum length devices.

6. The field effect transistor according to claim 1, wherein said field effect transistor is a silicon-on-insulator transistor.

* * * * *